US008841579B2

(12) United States Patent
Doemer

(10) Patent No.: US 8,841,579 B2
(45) Date of Patent: Sep. 23, 2014

(54) LASER PROCESSING SYSTEM, OBJECT MOUNT AND LASER PROCESSING METHOD

(75) Inventor: Holger Doemer, Bopfingen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 625 days.

(21) Appl. No.: 13/029,453

(22) Filed: Feb. 17, 2011

(65) Prior Publication Data

US 2011/0198326 A1    Aug. 18, 2011

(30) Foreign Application Priority Data

Feb. 17, 2010   (DE) .......................... 10 2010 008 296

(51) Int. Cl.
| | |
|---|---|
| *B23K 26/16* | (2006.01) |
| *A61N 5/00* | (2006.01) |
| *B23K 26/30* | (2014.01) |
| *B23K 26/03* | (2006.01) |
| *B23K 26/36* | (2014.01) |
| *B23K 26/08* | (2014.01) |
| *B23K 26/12* | (2014.01) |

(52) U.S. Cl.
CPC .......... *B23K 26/0807* (2013.01); *B23K 26/426* (2013.01); *B23K 26/032* (2013.01); *B23K 26/36* (2013.01); *B23K 26/122* (2013.01)
USPC ................................... 219/121.72; 250/492.2

(58) Field of Classification Search
USPC ................. 219/121.6–121.83; 250/306–311, 250/492.1–492.3
See application file for complete search history.

(56) References Cited

U.S. PATENT DOCUMENTS 4,298,803 A * 11/1981 Matsuura et al. .......... 250/492.2
4,508,968 A * 4/1985 Kobayashi et al. ...... 250/441.11
(Continued)

FOREIGN PATENT DOCUMENTS

| JP | 62-71158 | 4/1987 |
|---|---|---|
| JP | 2004-130341 | 4/2004 |
| WO | WO 2010/006067 | 1/2010 |

OTHER PUBLICATIONS

German Office action, with English translation, for corresponding DE Application No. 10 2010 008 296.1, dated Sep. 23, 2010.

(Continued)

*Primary Examiner* — Sang Y Paik
(74) *Attorney, Agent, or Firm* — Fish & Richardson P.C.

(57) ABSTRACT

A processing system includes a common base, an object mount configured to hold an object for inspection or processing, and at least one aperture plate provided on the object mount. The aperture plate has at least one aperture The processing system also includes a laser device mounted on the common base and configured to scan a laser beam across a scan region, and a transport device configured to displace the object mount relative to the common base from a first position to a second position. When the object mount is in the first position, the object and the at least one aperture are positioned within the scan region of the laser device. The processing system also includes at least one light guide provided on the object mount. The light guide has an input port provided by the at least one aperture, and an output port. The processing system also includes at least one light detector mounted at a fixed position relative to the common base and configured to detect light emerging from the output port of the light guide.

26 Claims, 4 Drawing Sheets

(56) References Cited

U.S. PATENT DOCUMENTS

| | | | |
|---|---|---|---|
| 4,713,537 A | | 12/1987 | Kunz et al. |
| 4,761,561 A | | 8/1988 | Fujiwara et al. |
| 6,023,068 A | * | 2/2000 | Takahashi .................. 250/492.2 |
| 6,501,061 B1 | | 12/2002 | Kitai et al. |
| 6,777,678 B1 | * | 8/2004 | Vanderlinde ..................... 850/9 |
| 6,855,938 B2 | | 2/2005 | Preikszas et al. |
| 6,963,069 B2 | * | 11/2005 | Tanba et al. ................... 250/311 |
| 2005/0184251 A1 | | 8/2005 | Oi et al. |
| 2005/0205778 A1 | | 9/2005 | Kitai et al. |
| 2009/0162156 A1 | | 6/2009 | Collins |
| 2009/0309025 A1 | | 12/2009 | Preikszas |
| 2010/0051828 A1 | | 3/2010 | Doemer et al. |

OTHER PUBLICATIONS

Extended European Search Report for corresponding EP Appl No. 11001317.4, dated Jul. 8, 2011.

* cited by examiner

LASER PROCESSING SYSTEM, OBJECT MOUNT AND LASER PROCESSING METHOD

CROSS-REFERENCES TO RELATED APPLICATIONS

The present application claims priority under 35 U.S.C. §119 to German Patent Application Serial No. 10 2010 008 296.1, filed Feb. 17, 2010 in Germany, entitled "LASER PROCESSING SYSTEM, OBJECT MOUNT AND LASER PROCESSING METHOD", the contents of which are hereby incorporated by reference in their entirety.

FIELD

The present disclosure relates to a laser processing system, a laser processing method and an object mount which can be used in the laser processing system and the laser processing method.

BACKGROUND

Laser beams are widely used for processing of objects, wherein the processing may include modifying material properties of the object and removing material from the object. For this purpose, a laser beam having sufficient beam energy and photon energy is directed to predetermined processing locations of the object using a laser scanner. This can be achieved by adjusting scan positions of the laser scanner based on coordinates of the processing locations in a coordinate system of the laser scanner. For this purpose, the coordinates of the desired processing locations are transformed into scan positions of the laser scanner. Preferably, parameters of such transformation are calibrated. Systems and methods for calibrating a laser scanner are known, for example from U.S. Pat. No. 6,501,061 B1 and US 2005/0205778 A1, wherein the full disclosure of these documents is incorporated herein by reference.

SUMMARY

It has been found that conventional laser processing systems and laser processing methods have an insufficient performance in applications involving an accuracy of less than 0.01 mm and/or in applications involving movements of the object between a position in which the laser processing occurs and a position in which an inspection or processing using an additional device occurs.

The present disclosure provides a laser processing system and a laser processing method, which allow processing an object with a relatively high accuracy and/or transport of the object back and forth between a position in which the processing using a laser beam occurs and a position in which a processing or inspection using other beams occurs.

According to embodiments, an object mount is configured to hold an object in both a laser processing device and an additional device for processing or inspection of the object and to transport the object back and force between the two devices.

According to embodiments, the object mount includes at least one object carrier configured to hold the object, at least one aperture plate having at least one aperture, and at least one light guide having at least one input port provided by the at least one aperture and an output port.

It is possible, with such object mount, to position an object mounted on the object carrier in a laser processing device in order to process the object at selected pressing locations using a laser beam of the laser device. It is further possible to calibrate a laser scanner of the laser device by scanning the laser beam across one or more apertures of the at least one aperture plate and wherein laser light emerging from the output port of the light guide is detected in dependence of current scan deflections provided by the laser scanner.

Diameters of the at least one aperture of the at least one aperture plate can be less than 2 mm, less than 1 mm, less than 500 μm, less than 200 μm, less than 100 μm, less than 50 μm, less than 20 μm, less than 10 μm, less than 5 μm or less than 2 μm. On the other hand, the diameters can be greater than 0.1 μm, greater than 1 μm, greater than 2 μm or greater than 5 μm.

According to embodiments, the object mount can be removed from the laser processing device without moving the detector. It is thus possible to transport the object mount to a further processing device or inspection device without moving the detector.

According to embodiments, the light guide is configured such that laser light entering the light guide via the aperture of the aperture plate is not directly incident on the detector. Such direct incidence of laser light can be undesirable if the laser light has a high intensity and may damage the detector. This can be avoided by designing the light guide such that an intensity of the laser light emerging from the output port of the light guide is reduced by internal reflections of the laser light within the light guide.

According to embodiments herein, the light guide is configured such that there does not exist a beam path along a straight line between the aperture and the output port of the light guide such that a laser beam incident into the light guide via the aperture experiences one or more internal reflections within the light guide before it can emerge from the light guide at the output port.

According to embodiments, the light guide has at least two straight channel portions extending under an angle relative to each other. For example, such angle may amount to more than 20°.

According to embodiments, a processing system includes a base and a laser device including a laser scanner mounted on the common base, wherein the laser scanner is configured to scan a laser beam across a scan region. The processing system further includes an object mount configured to hold an object for processing, and wherein at least one aperture plate having at least one aperture is provided on the object mount. The object mount provides a light guide having an input port provided by the at least one aperture and at least one output port. A light detector is mounted relative to the base such that laser light of the laser beam entering the light guide via the aperture emerges from the output port of the light guide and is incident on the light detector. Herein, it is possible to determine a position of the aperture relative to the laser scanner by scanning, using the laser scanner, the laser beam across the aperture and recording light intensities detected by the light detector in dependence of a scan deflection provided by the laser scanner. The determined position of the aperture of the object mount may, for example, provide an origin or other reference point of a coordinate system of the object mount. If a coordinate of a processing location is known relative to a coordinate system of the object mount, wherein processing of the object at the processing location is desired, it is then possible to direct the laser beam to the desired processing location with a high accuracy.

Two or more apertures can be provided at the object mount, wherein the two or more apertures provide input ports for the one or more light guides. The one or more light guides have one or more output ports supplying incident laser light to one or more light detectors. It is thus possible to determine scan deflections corresponding to the positions of the two or more apertures in order to determine two or more reference points of the coordinate system of the object mount within the coordinate system of the laser scanner. This can further improve an accuracy with which the laser beam is directed to desired processing locations on the object.

According to embodiments, the laser processing system includes a transport device configured to displace the object mount relative to the laser scanner. According to embodiments herein, the object mount can be moved from a first position in which the object and the at least one aperture are located within the scan region of the laser scanner to a second position in which the object and the at least one aperture are positioned outside of the scan region of the laser scanner. According to an embodiment herein, the displacement of the object mount does not change a position of the at least one light detector relative to the laser scanner. The object and the at least one aperture can be displaced relative to the light detector, accordingly.

According to other embodiments, the object mount is located outside of a vacuum enclosure when the object mount is in its first position, and it is located within the vacuum enclosure, when the object mount is in its second position, wherein a movement path of the object mount from the first position to the second position traverses a door of the vacuum enclosure. According to an exemplary embodiment herein, the light detector is located outside of the vacuum enclosure. According to further exemplary embodiments, the door of the vacuum enclosure can be closed and the vacuum enclosure can be evacuated when the object mount is located in its second position. According to further embodiments, it is possible that the object mount is located in a further enclosure when it is in its first position, wherein the further enclosure can be evacuated or wherein the further enclosure can be filled with a gas having a predetermined composition, such as an inert gas.

According to exemplary embodiment, the object and the at least one aperture are located within the scan region of the laser scanner when the object mount is in the first position, and the object and/or the at least one aperture can be scanned using a further inspection or processing device when the object mount is in the second position. According to embodiments herein, the further inspection or processing device includes a particle beam device, such as an electron beam device or an ion beam device, generating a particle beam which can be scanned across the object in order to inspect or modify the object.

According to embodiments, the electron beam device includes an electron microscope.

According to embodiments, a processing method includes scanning of a particle beam across an object to be inspected or processed, and performing a first detection of particles emerging from the object due to the scanning of the particle beam. The scanning can be a scanning using, for example, an electron beam or an ion beam, and the detected particles can be, for example, electrons, such as secondary electrons or backscattered electrons, caused by the incident particles. Detection signals obtained by the first scanning can be analyzed in order to generate, for example, an image of the scanned region of the object. The signals can be further used to determine locations on the object which are subject to a subsequent laser processing. According to an exemplary embodiment, these locations are determined in a coordinate system of the particle beam device.

According to embodiments, the laser processing method further includes transporting the object back and forth between the laser device and the particle beam device. In particular, the method includes transporting the object away from the particle beam device and towards the laser scanner such that the object is finally positioned within the scan region of the laser scanner. The object is then processed using the laser beam by directing the laser beam onto a processing location of the object using the laser scanner. The laser beam will then supply radiation energy to the processing location in order to remove material from the object or to modify the object.

According to embodiments herein, the laser beam is directed to those processing locations which correspond to the processing locations determined based on the first detection, such that the effective processing locations are first determined by scanning using the particle beam and subsequently processed using the laser beam directed to the processing locations by the laser scanner.

According to embodiments, the laser processing method includes scanning of the at least one aperture using the particle beam device and performing a second detection of particles generated by such scanning. According to embodiments herein, a position of the at least one aperture relative to the object is determined based on the second detection. Herein, it is in particular possible to determine coordinates of the processing locations of the object relative to the at least one aperture.

According to embodiments, the laser processing method includes scanning the laser beam across the at least one aperture and performing a third detection of laser light traversing the at least one aperture. A position of the at least one aperture relative to the laser scanner can be determined by analyzing detection signals recorded in the third detection. If positions of the processing locations have previously been determined relative to the at least one aperture, it is now possible to direct the laser beam to these processing locations with a high accuracy.

BRIEF DESCRIPTION OF THE DRAWINGS

The forgoing as well as other advantageous features of the disclosure will be more apparent from the following detailed description of exemplary embodiments of the disclosure with reference to the accompanying drawings. It is noted that not all possible embodiments of the present disclosure necessarily exhibit each and every, or any, of the advantages identified herein.

DETAILED DESCRIPTION OF EXEMPLARY EMBODIMENTS

Figure 1:
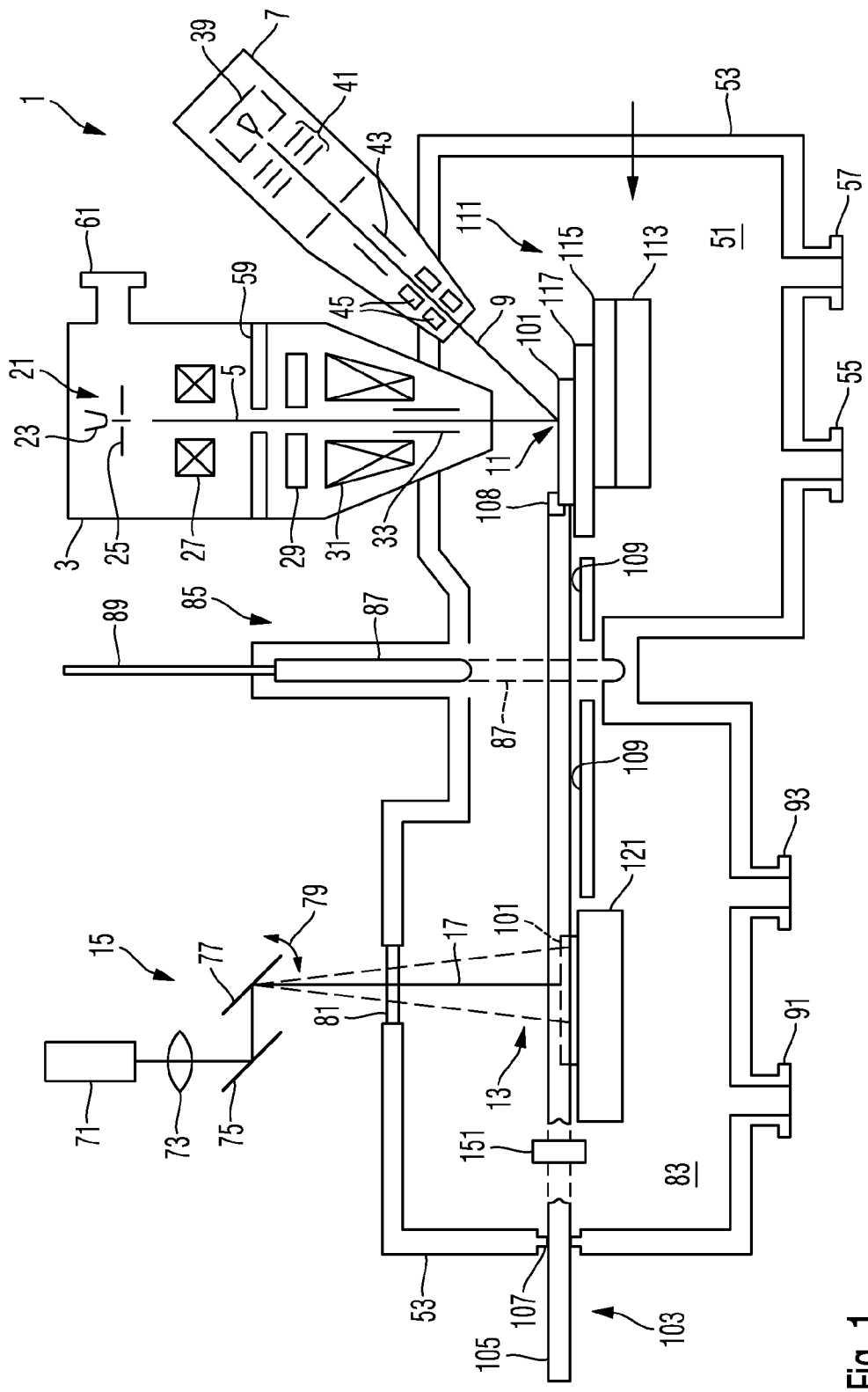
FIG. 1 is a schematic illustration of an embodiment of a laser processing system.

In the exemplary embodiments described below, components that are alike in function and structure are designated as far as possible by alike reference numerals. Therefore, to understand the features of the individual components of a specific embodiment, the descriptions of other embodiments and of the summary of the disclosure should be referred to.

FIG. 1 is a schematic illustration of a processing system 1.

The processing system 1 includes a particle beam device including two particle beam columns, including an electron beam column 3 for generating an electron beam 5, and an ion beam column 7 for generating an ion beam 9, wherein both the electron beam 5 and the ion beam 9 can be directed to locations within a processing region 11.

The electron beam column 3 is used to direct the electron beam 5 onto an object located within the processing region 11 and to detect secondary electrons or backscattered electrons. An electron microscopic image of a portion of the object can be determined by directing the electron beam to plural different locations on the object and detecting intensities of the secondary electrons or backscattered electrons associated with these locations. It is possible to determine processing locations of the object involving further processing based on such electron microscopic image. The further processing may include depositing material on the object at the processing locations or removing material from the object at the processing location.

The ion beam column 7 is used to direct the ion beam 9 to such processing locations. The ion beam 9 can remove material from the object at the processing locations, and it can activate deposition of material on the surface of the object at the processing locations. Herein, it is possible to supply a process gas to the processing location, wherein the process gas is activated by the ion beam such that it removes material from the object by a process, such as etching, or the activated process gas may deposit material at the object. Moreover, the ion beam can be used to generate an image of the object, similar to the electron beam.

The ion beam 9 allows removal of material from the object only at a limited rate. If a desired amount of material removal from the object involves an undesirable amount of processing time using the ion beam, the material removal can be achieved using a laser beam. For this purpose, the processing system 1 includes a laser device including a laser scanner 15 which is configured to direct a laser beam 17 to a scan region 17 and to scan the laser beam 17 across the scan region 13. A removal rate of material from the object using the laser beam can be greater than the removal rate achievable using the ion beam.

The electron beam column 3 includes an electron source 21 for generating the electron beam 5 and including a cathode 23, an anode 25 and a condenser lens system 27. The electron beam column 3 further includes an objective lens 31 for focusing the electron beam 5 within the processing region 11, and may include an electron detector 29 located within the column. The electron beam column 3 further includes beam deflectors 33 to vary a location of incidence of the electron beam 5 on the object and to scan the location of incidence across the surface of the object within the processing region. Particles released from the object due to the incident electron beam, such as secondary electrons or backscattered electrons can be detected with the detector 29 or some other detector to generate an electron microscopic image of the object within the scanned processing region.

The ion beam column 7 includes an ion source 39 and electrodes 41 for shaping and accelerating the ion beam 9. The ion beam column 7 further includes beam deflectors 43 and focusing coils or focusing electrodes 45 to focus the ion beam 9 within the processing region 11 and to scan the ion beam across a region of the object.

The processing system 1 includes a vacuum enclosure 53 defining a vacuum space 51 which can be evacuated using a vacuum pump (not shown in FIG. 1) connected to a suction port of the vacuum enclosure 53. A suitable gas, such as air, a process gas or an inert gas can be supplied to the vacuum space 51 via a port 57 to break the vacuum. The electron beam column 3 includes one or more pumping apertures 59 and a suction port 61 connected to a separate vacuum pump (not shown in FIG. 1), to allow continuous operation of the electron beam source 21 even when a process gas is supplied into the vacuum space 51.

Background information relating to systems providing one or more particle beams for processing of an object can be obtained from US 2005/0184251 A1, U.S. Pat. No. 6,855,938 and US 2009/0309025 A1, wherein the full disclosure of these documents is incorporated by reference into the present disclosure.

The laser scanner 15 includes a laser 71 and optics 73 configured to shape and focus the laser beam 17. The laser beam 17 is supplied to a location close to the vacuum enclosure 53 via one or more mirrors 75 or light guides. The laser beam is incident on a scan mirror 77 directing the beam towards the object to be processed. The scan mirror 77 can be tilted as indicated by an arrow 79 in order to scan the beam 17 across the processing region 13.

The laser beam 17 traverses a window 81 provided in the enclosure 53 also defining a vacuum space 83 of the laser scanner 15. The vacuum space 83 can be separated from the vacuum space 51 by a door 87. The door includes a plate which can be moved by an actuating rod 89 between an opening position of the door as illustrated by a full line, and a closing position of the door as illustrated by broken lines. The door 85 may provide a vacuum tight lock in that the plate is sealed against the vacuum enclosure 53 such that different pressures or qualities of vacuum can be maintained in the vacuum spaces 51 and 83. The vacuum space 83 can be evacuated via a pump port 91, and it can be supplied with air or some other gas via a port 93.

The object to be processed is mounted on an object mount 101 and can be transported back and forth between two positions together with the object mount 101. The processing system 101 includes a transport device 103 to achieve such displacement of the object. The transport device 103 includes, in the illustrated example, a rod 105 carrying, at one end thereof, a connector 108 configured to releasably attach the object mount 101. With the object mount 101 attached to the rod 105, the rod can move the object mount 101 from its position at the right in FIG. 1 where it is illustrated in full lines in FIG. 1 with the object located within the processing region 111, to the position where the object mount 101 is shown in broken lines where the object is positioned within the processing region 13 of the laser beam 17. Similarly, the object mount 101 can be moved from the left position in FIG. 1 to the right position by operating the transport device 103.

The transport device 103 includes a sealing port 107 provided in the vacuum enclosure 53, wherein the sealing 107 seals the rod 105 against the enclosure 53 and allows translating of the rod 105 for moving the object mount 101 between the two positions without braking the vacuum in the vacuum spaces 51 and 83. Rails 109 or similar support can be provided to support the object mount 101 while it is moved between the two positions. The object mount 101 can be released from the rod 105 by operating the connector 108 such that the rod 105 can be withdrawn from the interior of the vacuum space 51 while the object mount 101 remains located in the vacuum space 51, such that the door 87 can be closed in order to improve the vacuum within vacuum space 51.

When the object mount 101 is positioned within the vacuum space 51, it is supported by a stage 111 configured to displace the object mount 101 relative to the particle beams 5 and 9 such that the beams 5 and 9 can be directed onto the object from different directions. The stage 111 includes a base 113 and one or more intermediate components 115 carrying a component 117 at which the object mount 101 is fixed. The components 113, 115 and 117 can be moved relative to each other to allow displacement of the object mount 101 in three linear directions x, y and z and to allow orientation of the object mount 101 in two angular directions θ, and φ relative to the particle beams 5 and 9.

When the object mount 101 is located within vacuum space 83, it is supported by a stage 121 allowing positioning of the object mount 101 such that the object is located within the processing region 13 of the laser scanner 15.

Other embodiments of processing systems allowing combined processing of an object using a laser beam and one or more particle beams are illustrated in US 2010/0051828 A1, the full disclosure of which is incorporated herein by reference.

Figure 2:
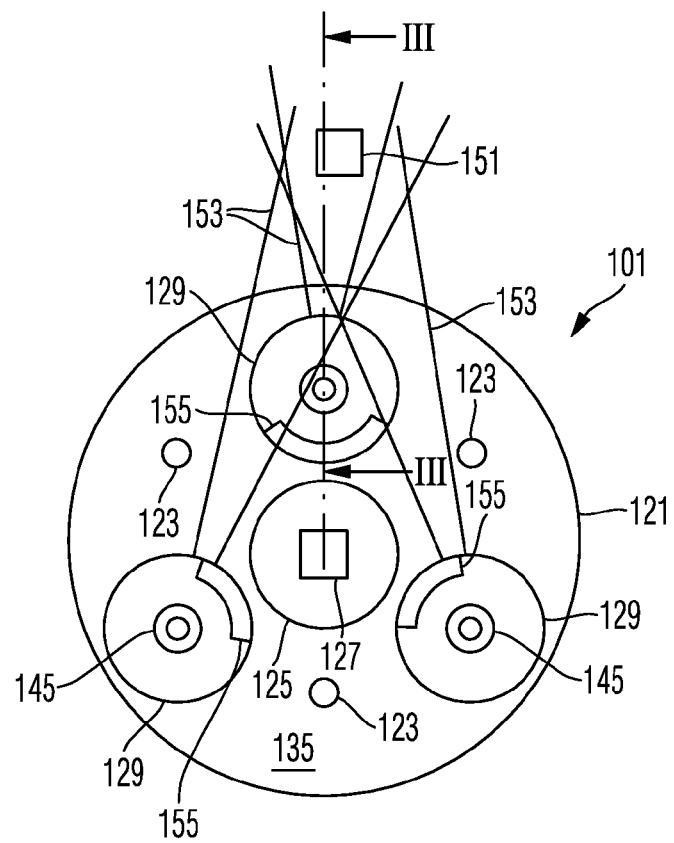
FIG. 2 is an illustrative elevational view of an embodiment of an object mount which can be used in the laser processing system shown in FIG. 1.
Figure 3:
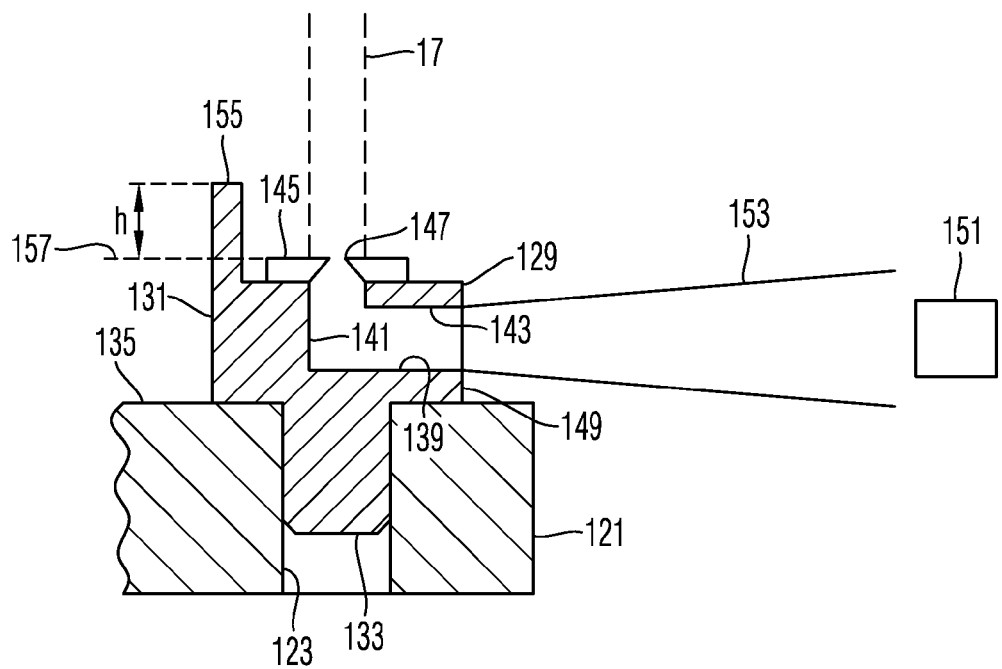
FIG. 3 is a schematic section of the object mount shown in FIG. 2 along line III-III.

FIG. 2 is an elevational view of the object mount 101 when it is located in the left position of FIG. 1, and FIG. 3 is a sectional view of a portion of the object mount 101 along a line III-III in FIG. 2.

The object mount 101 includes a base body 121 which can be provided, for example, by a plate having a circular upper surface 135. The object mount 101 includes plural fixtures 123 which can be provided by bore provided in the body 121. In the example illustrated with reference to FIGS. 2 and 3, the object mount 101 has seven fixtures 123 wherein one fixture is located at the center of the circular base 121 and wherein six fixtures are distributed about the central fixture. An object carrier 125 is received in the central fixture 123 and carries the object 127 to be processed. Aperture carriers 129 are received in three of the seven fixtures 123. Each aperture carrier 129 includes a body 131 and a pin 133 which can be inserted into the bore 123 until the body 131 is in contact with the upper surface 135 of the base body 121 of the object mount 101. Other configurations and numbers of fixtures provided on the base body 121 are possible. It is, in particular, possible to offer different types of fixtures for the object carrier and the aperture carrier, such that an aperture carrier cannot be received in a fixture provided for the object carrier. It is also possible that the aperture carriers and/or the object carriers are fixedly provided on the object mount 101 and cannot be removed from the object mount.

The body 131 of the aperture carrier includes an L-shaped channel 139 having a first channel portion 141, vertically oriented in FIG. 3, and a second channel portion 143 horizontally oriented in FIG. 3, such that the first and second channel portions 141, 143 extend under an angle of 90° relative to each other, which is, in particular, greater than 20°.

The channel 139 provides a light guide having an entry port provided by an aperture 147 provided in an aperture plate 145 mounted on the aperture carrier mounted on the body 131.

The laser beam 17 can be scanned across the upper surface 135 of the object mount 101, wherein the laser beam may traverse the aperture 147 and enter into the light guide 139 at certain scan positions of the laser beam 17. Such scan position is illustrated in FIG. 3. The laser light entering into the channel 139 is reflected and scattered one or more times at a wall of the channel, and a portion of this light can emerge from an output port 149 of the light guide 139 as a scattered light beam 153. The scattered light beam 153 is incident on a light detector 151 configured to output signals representing intensities of incident laser light. In the illustrated embodiment, the light detector 151 is located within the vacuum space 83. According to other embodiments, the light detector 151 can be located outside of the vacuum space 83, wherein a suitable window is provided in the vacuum enclosure 53 to allow laser light emerging from the output port of the light guide to reach the light detector. The light detector is fixedly mounted relative to the vacuum enclosure 53 and is not moveable together with the object mount 101. In this illustrated example, the vacuum enclosure 53 provides a common base relative to which the laser device, the particle beam device and the light detector are fixedly mounted and relative to which the object mount is moveable.

As mentioned above, the channel 139 provides a light guide for the laser light of the laser beam 17, wherein the laser light enters into the light guide via the aperture 147 such that the aperture plate 145 and aperture 147 provide an input port of the light guide, and wherein the light emerging from the light guide via the output port 149 can be received by the detector 151. It is possible to determine a position of the aperture 147 in a coordinate system of the laser scanner 15 by scanning the laser beam across the aperture 147 and analyzing detection signals of the light detector 151. Background information relating to a determination of a position of an aperture relative to a laser scanner can be obtained from U.S. Pat. No. 6,501,061 B1 and US 2005/0205778 A1, wherein the full disclosure of these documents is incorporated herein by reference. In the illustrated embodiment, the portion of the laser beam traversing the aperture 147 and entering the light guide is not directly incident onto the light detector 151. Only a portion of the laser light entering the light guide is incident on the detector due to the one or more reflections which the incident light rays experience before they are incident on the detector. This results in a significant reduction of the laser light intensity and prevents damage of the light detector which could otherwise occur if laser light is directly incident on the detector. According to other embodiments, it is, however, possible to configure the light guide such that laser light traversing the aperture 147 is directly incident on the detector. In such situation, it is preferable to provide light attenuators, such as filters, to prevent damage of the light detector.

In the illustrated embodiment, the light guide is formed by the L-shaped channel having two channel portions 141, 143 extending under an angle of 90° relative to each other. According to other embodiments, it is possible to provide light guides having three or more channel portions or having curved channel portions. While the light guide of the illustrated embodiment is provided by a hollow channel provided in the base body 131 of the aperture carrier, it is also possible to provide the light guide by transparent light guiding material, such as glass or plastics according to other embodiments. Moreover, such light guiding transparent material can be a nonlinear optical material achieving a frequency shift of the incident laser light, or the material may provide luminescent optical properties. Such selection of light guiding material may have an advantage if the laser light is from ultraviolet or infrared wavelength ranges while the light detector is sensitive at wavelength ranges different from the laser light, such as visible light.

Each of the aperture carriers 129 mounted on the object mount 101 is oriented such that laser light beams 153 emerging from the output ports of the respective aperture carriers is incident on the same common light detector 151 (see FIG. 2). With such configuration, it is possible to determine the positions of all three apertures 147 by scanning the laser beam 17 across the respective apertures and analyzing the detection signals of the single light detector 151. According to alternative embodiments, plural light detectors are provided, wherein each light detector is associated with one single aperture carrier and configured such that it receives light from only one aperture carrier.

The light detector can be of any type as long as it is configured to detect light emerging from the output port 149 of the aperture carrier 131. For example, the light detector may include a photodiode or a CCD-sensor.

Figure 4:
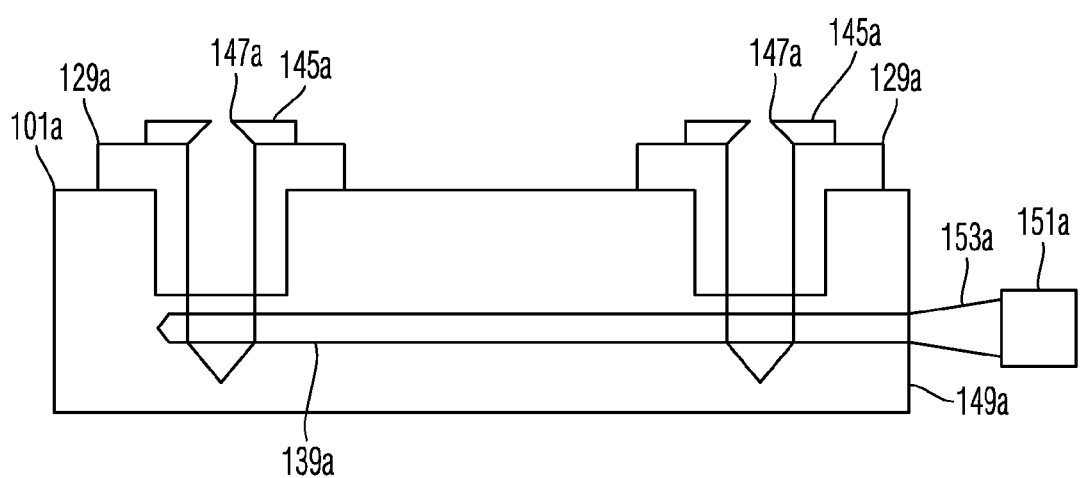
FIG. 4 is a sectional view of an object mount according to a further embodiment.

FIG. 4 is a schematic illustration of a cross section of an object mount 101a according to a further embodiment. The object mount 101a includes two aperture plates 145a, wherein an aperture 147a is provided in each aperture plate 145a. The object mount 101a provides a common light guide 139a for both apertures 147a, wherein laser light entering the light guide 139a via the apertures 147a, which provide input ports to the light guide 139a, emerges from a single common output port 149 such that it is incident on a light detector 151a.

As shown in FIG. 3, the aperture carrier 129 may include a wall 155 projecting from a plane 157 in which the aperture 147 is arranged by a height h. The height h may be from within a range of 2 mm to 15 mm. Exemplary value of the height h are 5 mm and 10 mm. The wall 155 has a function of preventing particles generated by the processing of the object 127 from depositing at the aperture 147. Particles deposited at the aperture 147 may change the geometry of the aperture and deteriorate the accuracy of the determination of the position of the aperture when it is scanned with the laser beam. The wall 155 may extend completely around the aperture, or only along a portion of the periphery of the aperture, as it is apparent from the elevational view of FIG. 2.

In the illustrated examples, separate object carriers and aperture carriers are used to mount the object and apertures on the object mount 101. According to other exemplary embodiments, the object and apertures are directly applied to the object mount, without intermediate carrier, and wherein the light guide is provided by the base body of the object mount.

According to further examples, the apertures or the objects are fixed to separate carriers which are fixed to the object mount. Exemplary variations include: (a) objects and apertures are fixed to different object carriers and aperture carriers; (b) objects are fixed to a first object carrier, and all apertures are provided on a second aperture carrier which can be, for example, a ring-shaped plate; and (c) objects and apertures are fixed to a common support, such as the base body of the object mount, for example.

According to further examples, light emerging from the output port of the object mount is collected by a further light guide, such as a fiber bundle, and supplied to a location close to the light detector. The further light guide can be mounted on the object mount. Further, the output port of the light guide can be oriented such that the emitted light is directed to the light detector, which can be positioned at a greater distance from the output port.

According to further examples, channel portion of the light guide may have different diameters.

According to further examples, a channel portion of the light guide is completely or partially filled with a transparent light guiding material, such as glass, a wavelength converting material or other material.

According to further examples, an inner surface of at least one channel portion of the light guide is modified to have particular physical properties. The modification may include provision of a predetermined surface roughness or provision of a coating which may, for example, have particular dielectric properties, anti corrosive properties etc.

According to further examples, the diameter of the aperture providing the input port of the light guide is variable. Such variable aperture can be provided by an iris type aperture.

According to further examples, the aperture providing the input port of the light guide has a noncircular shape, such as an oval shape or a polygonal shape.

According to further examples, the diameter or shape of the aperture providing the input port of the light guide can be changed. For example, plural apertures can be provided on a slider or wheel, wherein a desired selected aperture can be positioned at the light guide by movement of the slider or wheel, respectively.

According to further examples, one aperture plate may have plural apertures having a same diameter and geometry or having different diameters and/or different geometries. In such examples, the apertures of greater diameters can be scanned and used for a rapid determination of the position of the aperture, and the smaller apertures can be scanned and used for a more accurate determination of the position of the aperture.

According to still further examples, one or more of plural apertures can be covered if they are currently not used or if they should be protected from contamination. Suitable plates or covers can be provided to protect the apertures from contamination which may occur during processing of the object with the laser beam.

According to further examples, the aperture defining the input port of the light guide is provided in a recessed portion of the aperture plate.

Figure 5:
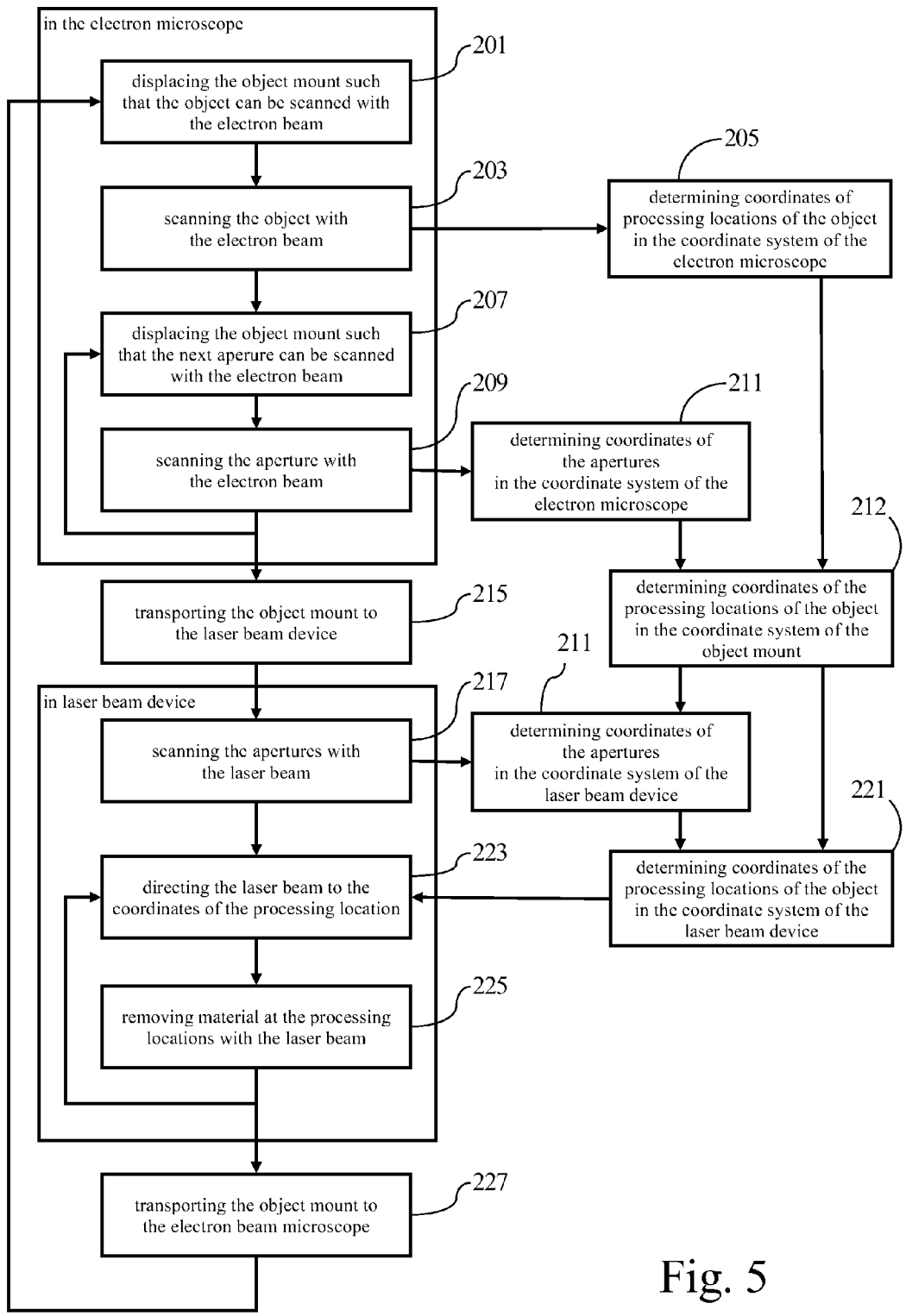
FIG. 5 is a flow diagram illustrating an embodiment of a laser processing method.

FIG. 5 is a flow chart illustrating an embodiment of a processing method. According to exemplary embodiments, the processing method shown in FIG. 5 is performed using the processing system shown in FIG. 1 and with an object mount as shown in FIGS. 2 to 4.

In the method, an object to be processed is mounted on an object carrier of an object mount. One or more apertures are also provided on the object mount. The object mount is moved to an inspection device, such as an electron microscope. In a step 201, the object mount is displaced relative to the inspection system such that the object can be scanned using a beam probe of the inspection system, which is an electron beam probe if the inspection system is an electron microscope. The present embodiment is illustrated with reference to an electron microscope below. It is, however, possible to use other inspection systems, such as ion beam inspection systems rather than the electron microscope.

The object is scanned in a step 203, wherein secondary electron intensities are detected in order to generate an electron microscopic image of the region of the object scanned with the electron beam. Locations at which removal of object material is desired are determined in a step 205. Coordinates of such processing locations are determined in a coordinate system of the electron microscope.

In a step 207, the object mount is displaced relative to the electron microscope such that an aperture of an aperture plate can be scanned with the electron beam. The aperture is scanned with the electron beam in a step 209, and coordinates of the scanned aperture are determined in a step 211 by analyzing detected secondary electron intensities recorded during the scanning. The steps 207, 209 and 211 can be repeated to obtain positions of two or more apertures in the coordinate system of the electron microscope. The coordinates of the processing locations determined in step 205 are transformed into a coordinate system of the object mount in a step 212, wherein the coordinate system of the object mount includes the positions of the apertures as reference points. The positions of the processing locations are known relative to the locations of the apertures in step 212, accordingly. The object mount carrying the object and the apertures and having the objects and apertures fixedly attached to the object mount is transported to a laser device in a step 215. The object mount is positioned relative to a laser scanner of the laser device such that the object and the apertures are located within a scanning region of a laser beam produced by the laser device. The apertures are scanned with the laser beam in a step 217, and intensities of laser light traversing the apertures are recorded by one or more light detectors. Positions of the apertures in the coordinate system of the laser device are determined in a step 219 from the detected light intensities. A transformation of coordinates of the object mount into coordinates of the laser device is determined in a step 221. Step 221 also includes calculation of the coordinates of the processing locations in the coordinate system of the laser device using the determined transformation. For each processing location, the laser beam is directed to the respective processing location in a step 223, and material is removed from the object at the processing location in a step 225. The steps 223 and 225 are repeatedly performed for each processing location, using the coordinates of the laser device determined in step 221.

All the above steps or individual steps or selected groups of the above steps can be repeatedly performed until a desired processing is achieved. In particular, processing in the laser device and the inspection device can be repeatedly performed until a desired processing is achieved. Achievement of the desired processing can be determined, for example, by comparing an inspection result, such as an electron microscopic image recorded with the electron microscope, with a desired model image or other criteria.

For example, the object mount carrying the object and the apertures can be transported in a step 227 back to the electron microscope to verify that the processing with the laser beam is completed as desired. Thereafter, the steps 201, 203 and 205 can be performed again, in order to determine further processing locations. Positions of the apertures can be determined again in steps 207, 209 and 211. Such processing is, however, optional since the positions of the apertures in the coordinate system of the electron microscope were previously determined. However, the repeated determination of the positions of the apertures in the electron microscope may contribute to an increased accuracy of the determination of the coordinates of the further processing locations.

Subsequent to the determination of further processing locations, the object can be transported to the laser device (step 215) for further material removal. If further material removal using the laser device is not necessary, coordinates of processing locations for processing using an ion beam can be determined in steps 201, 203 and 205. Thereafter, the ion beam can be directed to the processing location in order to remove material from the object using the ion beam or to deposit material on the object using the ion beam.

While the disclosure has been described with respect to certain exemplary embodiments thereof, it is evident that many alternatives, modifications and variations will be apparent to those skilled in the art. Accordingly, the exemplary embodiments of the disclosure set forth herein are intended to be illustrative and not limiting in any way. Various changes may be made without departing from the spirit and scope of the present disclosure as defined in the following claims.

What is claimed is:

1. A system, comprising:
   a base;
   an object mount configured to hold an object for inspection and/or processing, the object mount having a first position relative to the base, and the object mount having a second position relative to the base;
   an aperture plate having an aperture;
   a laser device configured to scan a laser beam across a laser beam scan region, the laser device being supported by the base;
   a transport device configured to move the object mount between the first and second positions; and
   a light detector fixed relative to the base,
   wherein:
   when the object mount is in the first position and the object mount is holding the object, the object and the aperture are positioned within the laser beam scan region;
   the system has a light guide between the laser device and the light detector;
   the light guide has an inlet port and an outlet port;
   the inlet port of the light guide is defined by the aperture; and
   the light detector is configured so that, during use of the system, the light detector detects light emerging from the output port of the light guide.

2. The system of claim 1, wherein the aperture plate is supported by the object mount.

3. The system of claim 1, wherein the aperture plate is mounted on the object mount.

4. The system of claim 1, wherein the laser device is mounted on the base.

5. The system of claim 1, wherein:
   the system has a vacuum enclosure;
   when the object mount is in the first position, the object mount is positioned outside the vacuum enclosure; and
   when the object mount is in the second position, the object mount is located in the vacuum enclosure.

6. The system of claim 5, wherein the object mount moves through an opening of the vacuum enclosure when the object mount is moved between the first and second positions.

7. The system of claim 6, further comprising a door that can seal the opening of the vacuum enclosure so that the vacuum enclosure can be evacuated when the object mount is in the second position.

8. The system of claim 1, further comprising a particle beam device configured to scan a particle beam across a particle beam scan region, wherein, when the object mount is in the second position and the object mount is holding the object, the object and the aperture can be selectively positioned within the particle beam scan region.

9. The system according to claim 1, wherein:
   the system has a plurality of light guides between the laser device and the light detector; and
   each of the plurality of light guides has an inlet port and an outlet port.

10. The system of claim 9, wherein:
    the system comprises a plurality of light detectors; and
    the plurality of light detectors are configured so that, during use of the system, each of the plurality of light detectors detects light emerging from a corresponding output port.

11. The system of claim 9, wherein the light detector is configured so that, during use of the system, the light detector detects light emitted from the output port of each of the plurality of light guides.

12. The system of claim 9, wherein:
    the system comprises a plurality of apertures; and
    for each of the plurality of light guides, the input port is defined by a corresponding aperture.

13. The system of claim 12, wherein, for each aperture, a diameter of the aperture is less than 2 mm.

14. The system of claim 1, wherein a diameter of the aperture is less than 2 mm.

15. The system of claim 1, wherein, during use of the system, light entering the light guide at the inlet port has a greater intensity than light exiting the light guide at the output port.

16. The system of claim 1, wherein, during use of the system, the light undergoes multiple reflections in the light guide between the inlet port and the output port.

17. The system of claim 1, wherein the light guide comprises a first portion and a second portion, the first portion extending at an angle of at least 20° relative to the second portion.

18. The system of claim 1, wherein the angle is at most 90°.

19. A system, comprising:
a base;
an object mount configured to hold an object for inspection and/or processing, the object mount having a first position relative to the base, and the object mount having a second position relative to the base;
an aperture plate having an aperture;
a laser device configured to scan a laser beam across a laser beam scan region, the laser device being supported by the base;
a transport device configured to move the object mount between the first and second positions; and
a light detector fixed relative to the base,
wherein:
when the object mount is in the first position and the object mount is holding the object, the object and the aperture are positioned within the laser beam scan region;
the system has a light guide between the laser device and the light detector;
the light guide has an inlet port and an outlet port;
the inlet port of the light guide is defined by the aperture;
the light detector is configured so that, during use of the system, the light detector detects light emerging from the output port of the light guide; and
wherein:
the object mount comprises a plurality of holding fixtures; and
each holding fixture is configured to receive an aperture carrier on which the aperture plate is mounted, or each holding fixture is configured to receive an object carrier on which the object to be inspected or processed can be mounted.

20. The system of claim 19, wherein:
the system has a plurality of light guides between the laser device and the light detector; and
each of the plurality of light guides has an inlet port and an outlet port.

21. The system of claim 19, wherein:
the system has a vacuum enclosure;
when the object mount is in the first position, the object mount is positioned outside the vacuum enclosure; and
when the object mount is in the second position, the object mount is located in the vacuum enclosure.

22. The system of claim 21, wherein:
the system comprises a plurality of apertures; and
for each of the plurality of light guides, the input port is defined by a corresponding aperture.

23. A system, comprising:
a base;
an object mount configured to hold an object for inspection and/or processing, the object mount having a first position relative to the base, and the object mount having a second position relative to the base;
an aperture plate having an aperture;
a laser device configured to scan a laser beam across a laser beam scan region, the laser device being supported by the base;
a transport device configured to move the object mount between the first and second positions; and
a light detector fixed relative to the base,
wherein:
when the object mount is in the first position and the object mount is holding the object, the object and the aperture are positioned within the laser beam scan region;
the system has a light guide between the laser device and the light detector;
the light guide has an inlet port and an outlet port;
the inlet port of the light guide is defined by the aperture;
the light detector is configured so that, during use of the system, the light detector detects light emerging from the output port of the light guide; and
wherein:
the aperture plate has a surface and a wall projecting from the surface of the aperture plate; and
the wall is configured so that, during use of the system, the wall projects from the surface of the aperture plate in a direction of incidence of the laser beam by more than 0.5 mm.

24. The system of claim 23, wherein:
the system has a plurality of light guides between the laser device and the light detector; and
each of the plurality of light guides has an inlet port and an outlet port.

25. The system of claim 23, wherein:
the system has a vacuum enclosure;
when the object mount is in the first position, the object mount is positioned outside the vacuum enclosure; and
when the object mount is in the second position, the object mount is located in the vacuum enclosure.

26. The system of claim 23, wherein:
the system comprises a plurality of apertures; and
for each of the plurality of light guides, the input port is defined by a corresponding aperture.

* * * * *

UNITED STATES PATENT AND TRADEMARK OFFICE
CERTIFICATE OF CORRECTION

PATENT NO. : 8,841,579 B2
APPLICATION NO. : 13/029453
DATED : September 23, 2014
INVENTOR(S) : Holger Doemer It is certified that error appears in the above-identified patent and that said Letters Patent is hereby corrected as shown below:

Title Page, Col. 2, item (57), under ABSTRACT, line 4, second occurrence, delete "aperture" and insert -- aperture. --.

In the Drawings

Sheet 4/4, Figure 5, reference numeral 207, line 2, delete "aperure" and insert -- aperture --.

Signed and Sealed this
Thirteenth Day of January, 2015

Michelle K. Lee
*Deputy Director of the United States Patent and Trademark Office*